United States Patent
Shin

(10) Patent No.: US 12,205,756 B2
(45) Date of Patent: Jan. 21, 2025

(54) COIL COMPONENT

(71) Applicant: SAMSUNG ELECTRO-MECHANICS CO., LTD., Suwon-si (KR)

(72) Inventor: Sung Sik Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 781 days.

(21) Appl. No.: 17/108,409

(22) Filed: Dec. 1, 2020

(65) Prior Publication Data

US 2022/0013280 A1    Jan. 13, 2022

(30) Foreign Application Priority Data

Jul. 10, 2020 (KR) .................. 10-2020-0085321

(51) Int. Cl.
*H01F 27/33* (2006.01)
*H01F 17/04* (2006.01)
*H01F 27/29* (2006.01)

(52) U.S. Cl.
CPC ......... *H01F 27/292* (2013.01); *H01F 17/045* (2013.01); *H01F 27/33* (2013.01)

(58) Field of Classification Search
CPC ...... H01F 27/292; H01F 17/045; H01F 27/33; H01F 2017/048; H01F 27/40; H01F 17/04; H01F 17/0013; H01F 27/022; H01F 27/30; H03H 2001/0057
See application file for complete search history.

(56) References Cited

U.S. PATENT DOCUMENTS

| 10,204,741 | B2 * | 2/2019 | Matsunaga | ............ H03H 7/427 |
| 10,804,022 | B2 * | 10/2020 | Ishida | ................. C22C 32/0015 |
| 2017/0063322 | A1 | 3/2017 | Matsunaga | |
| 2020/0006949 | A1 | 1/2020 | Song et al. | |
| 2020/0219651 | A1 | 7/2020 | Kang et al. | |

FOREIGN PATENT DOCUMENTS

| JP | 2006032860 A | * | 2/2006 |
| KR | 10-2009-0019559 A | | 2/2009 |
| KR | 10-2017-0026135 A | | 3/2017 |
| KR | 10-2020-0001282 A | | 1/2020 |
| KR | 10-2130677 B1 | | 7/2020 |

OTHER PUBLICATIONS

Korean Office Action dated Nov. 29, 2024 issued in Korean Patent Application No. 10-2020-0085321 (with English translation).

* cited by examiner

*Primary Examiner* — Tuyen T Nguyen
(74) *Attorney, Agent, or Firm* — Morgan, Lewis & Bockius LLP

(57) ABSTRACT

A coil component includes a body including a core, a molded portion having one surface and the other surface opposing each other, and a side surface connecting the one surface and the other surface, and a cover portion disposed on the molded portion, first and second receiving grooves disposed in the one surface of the molded portion to be spaced apart from each other and disposed outside of a region corresponding to the core in the one surface of the molded portion, a wound coil disposed between the molded portion and the cover portion, having a plurality of turns around the core, and having both ends disposed in the first and second receiving grooves, respectively, and a first noise removal portion or a second noise removal portion.

20 Claims, 8 Drawing Sheets

COIL COMPONENT

CROSS-REFERENCE TO RELATED APPLICATION(S)

This application claims the benefit under 35 USC 119(a) of Korean Patent Application No. 10-2020-0085321 filed on Jul. 10, 2020 in the Korean Intellectual Property Office, the entire disclosure of which is incorporated herein by reference for all purposes.

TECHNICAL FIELD

The present disclosure relates to a coil component.

BACKGROUND

Inductors, as coil components, are representative passive electronic components used in electronic devices, along with resistors and capacitors.

As electronic devices have become increasingly better in terms of performance, and smaller, electronic components used in electronic devices are increasing in number and are being miniaturized in size.

For the above-described reasons, demands for removing noise such as electromagnetic interference (EMI) are gradually increasing, even in wound coil components.

SUMMARY

Exemplary embodiments provide a coil component from which noise may be easily removed.

An aspect of the present disclosure, a coil component includes a body including a core, a molded portion having one surface and the other surface opposing each other, and a side surface connecting the one surface and the other surface, and a cover portion disposed on the molded portion, first and second receiving grooves disposed in the one surface of the molded portion to be spaced apart from each other and disposed outside of a region corresponding to the core in the one surface of the molded portion, a wound coil disposed between the molded portion and the cover portion, having a plurality of turns around the core, and having both ends extending through at least a portion of the molded portion, and a noise removal portion disposed between an outermost turn of the wound coil and the cover portion, in such a manner that one end of the noise removal portion is exposed to the one surface of the molded portion.

According to an aspect of the present disclosure, a coil component includes a body including a core, a molded portion having one surface and the other surface opposing each other, and a side surface connecting the one surface and the other surface, and a cover portion disposed on the molded portion, first and second receiving grooves disposed in the one surface of the molded portion to be spaced apart from each other and disposed outside of a region corresponding to the core in the one surface of the molded portion, a wound coil disposed between the molded portion and the cover portion, having a plurality of turns around the core, and having both ends disposed in the first and second receiving grooves, respectively, and a noise removal portion disposed between an innermost turn of the wound coil and the core, in such a manner that one end of the noise removal portion is exposed to the one surface of the molded portion.

According to an aspect of the present disclosure, a coil component includes a body including a base portion having one surface and the other surface opposing each other, and a core extending from the other surface of the base portion, first and second receiving grooves spaced apart from each other in the one surface of the base portion, a wound coil having a plurality of conductive turns around the core, and having ends disposed in the first and second receiving grooves, respectively, and a noise removal portion including a plurality of conductive turns around the core. Only one end of the noise removal portion extends through the base portion to the one surface of the base portion.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
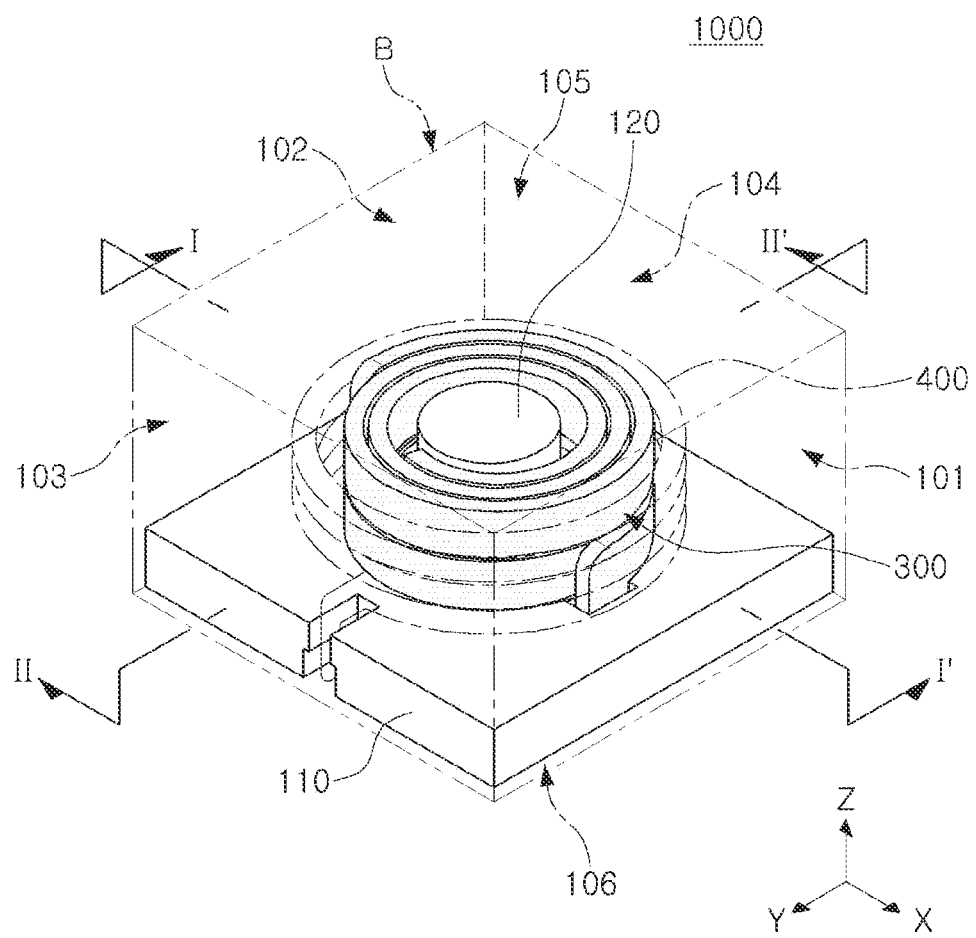
FIG. 1 is a view schematically illustrating a coil component according to a first embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly. Throughout the specification, the term "on" means to be positioned above or below the target portion, and does not necessarily mean to be positioned above the direction of gravity.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of the present disclosure. Further, although the examples described herein have a variety of configurations, other configurations are possible as will be apparent after an understanding of the disclosure of the present disclosure.

The drawings may not be to scale, and the relative sizes, proportions, and depiction of elements in the drawings may be exaggerated for clarity, illustration, and convenience.

Since the sizes and thicknesses of respective components illustrated in the drawings are arbitrarily illustrated for convenience of description, the present disclosure is not necessarily limited to the illustration of the drawings.

In the drawings, the X direction may be defined as a first direction or a length direction, the Y direction may be defined as a second direction or a width direction, and the Z direction may be defined as a third direction or a thickness direction.

Hereinafter, a coil component according to an embodiment will be described in detail with reference to the accompanying drawings, and in the description with reference to the accompanying drawings, the same or corresponding components are assigned the same reference numbers and overlapped descriptions thereof are omitted.

Various types of electronic components are used in electronic devices, and various types of coil components may be appropriately used between the electronic components, to remove noise or the like.

For example, coil components in electronic devices may be used as power inductors, high frequency inductors (HF inductors), general beads, high frequency beads (GHz beads), common mode filters, or the like.

First Embodiment

Figure 2:
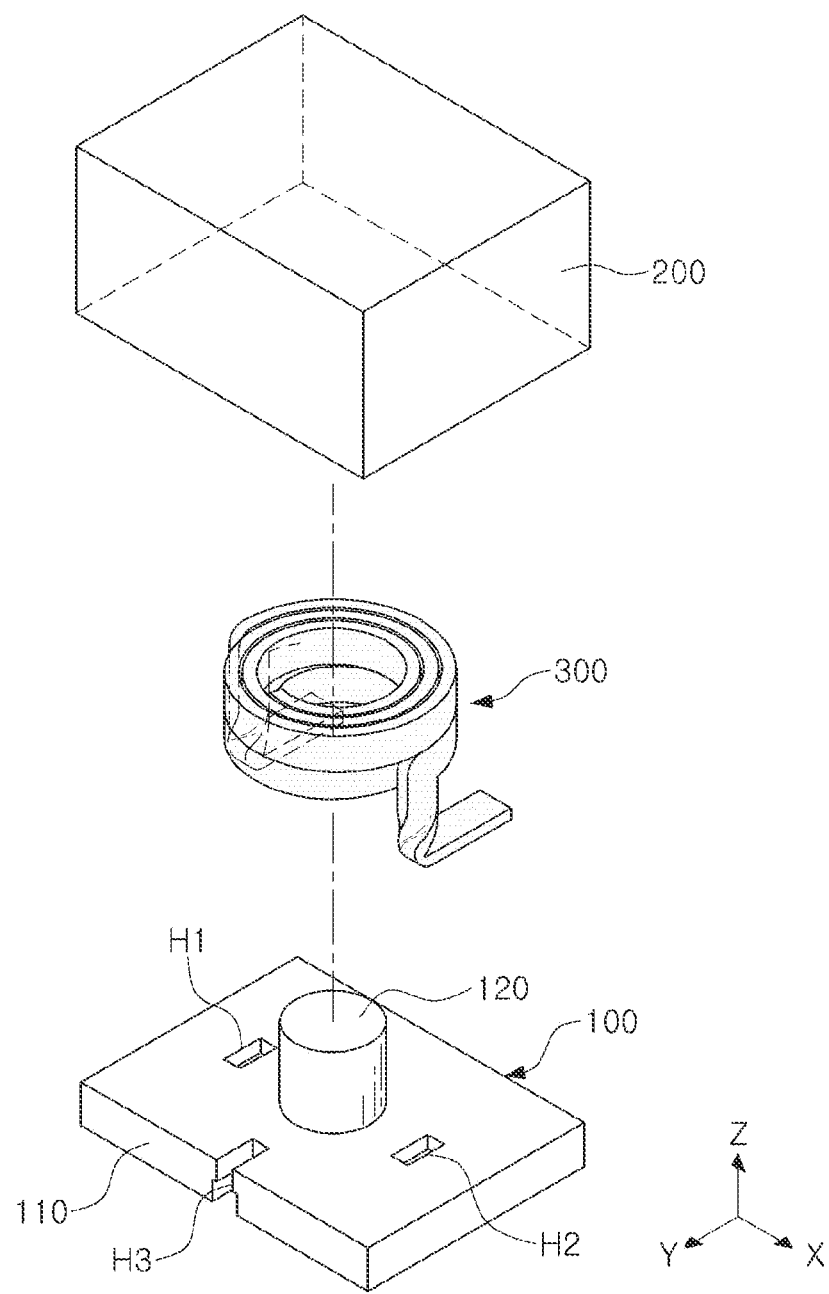
FIG. 2 is an exploded perspective view of FIG. 1.
Figure 3:
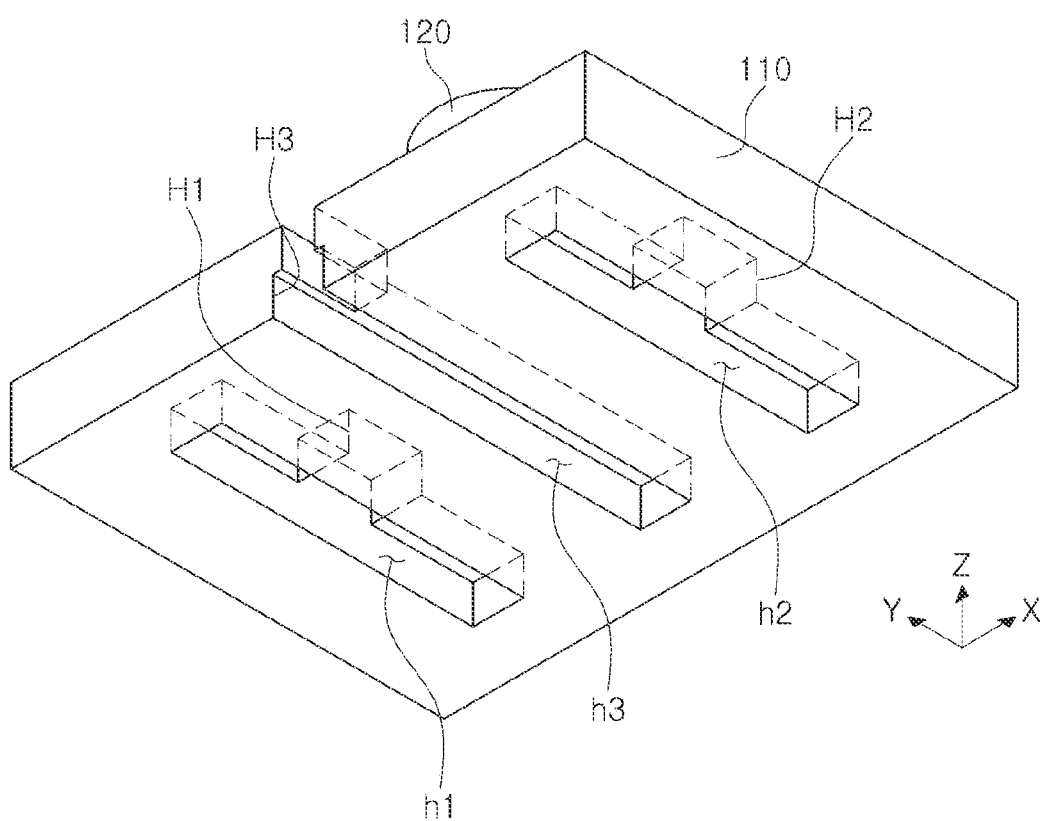
FIG. 3 is a perspective view of a molded portion as viewed from the bottom applied to the first embodiment.
Figure 4:
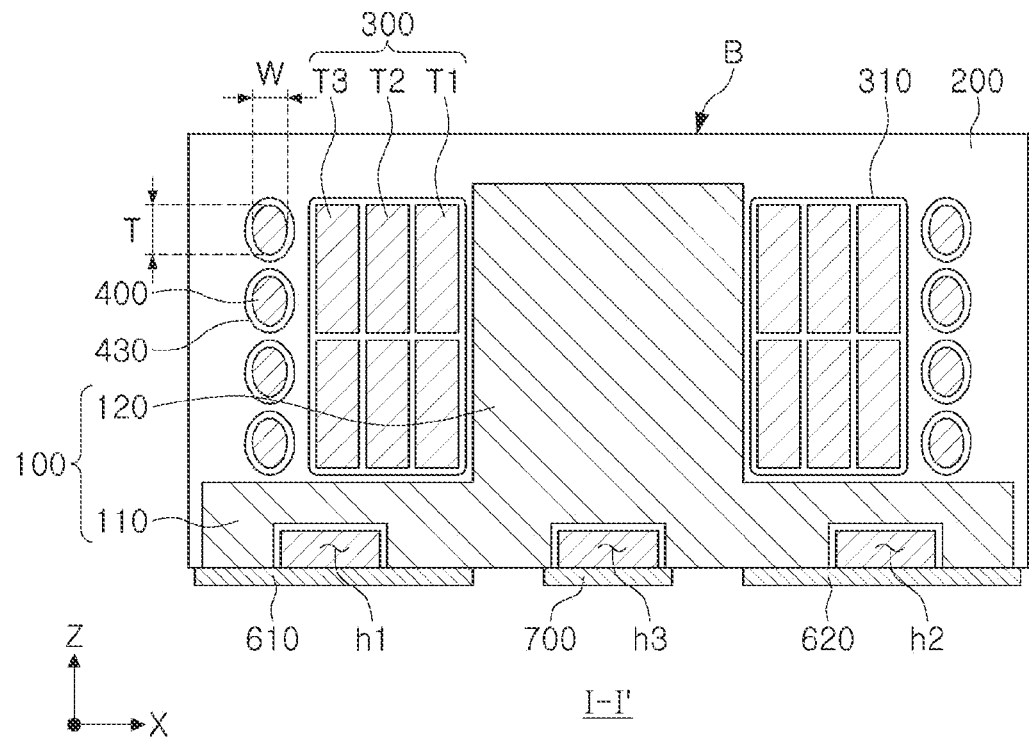
FIG. 4 is a view illustrating a cross section taken along line I-I' of FIG. 1.
Figure 5:
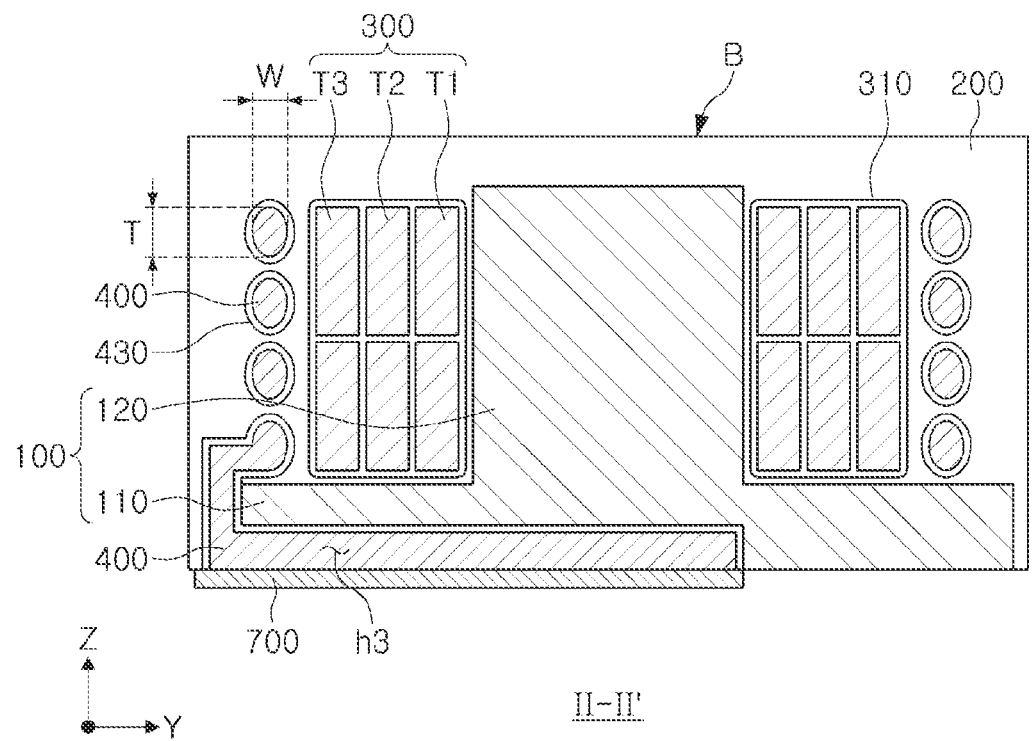
FIG. 5 is a view illustrating a cross section taken along line II-II' of FIG. 1.

FIG. 1 is a diagram schematically illustrating a coil component according to a first embodiment. FIG. 2 is an exploded perspective view of FIG. 1. FIG. 3 is a perspective view of a molded portion as viewed from the bottom of the molded portion applied to the first embodiment. FIG. 4 is a diagram illustrating a cross section taken along line I-I' of FIG. 1. FIG. 5 is a diagram illustrating a cross section taken along line II-II' of FIG. 1.

Referring to FIGS. 1 to 5, a coil component 1000 according to the first embodiment includes a body B, receiving grooves h1 and h2, a wound coil 300, a first noise removal portion 400 (not shown in FIG. 2), and a third receiving groove h3, and may further include first and second external electrodes 610 and 620 and a third external electrode 700. The body B includes a molded portion 100 and a cover portion 200. The molded portion 100 may include a core 120.

The body B forms the exterior of the coil component 1000 according to the present embodiment, and the wound coil 300 is embedded in the coil component.

The body B may be formed in the shape of a hexahedron as a whole.

The body B includes a first surface 101 and a second surface 102 opposing each other in the longitudinal direction X, and a third surface 103 and a fourth surface 104 opposing each other in the width direction Y, and a fifth surface 105 and a sixth surface 106 opposing each other in the thickness direction Z, based on FIG. 1.

The body B is formed in such a manner that the coil component 1000 according to the present embodiment in which the external electrodes 610 and 620 to be described later are formed has a length of 2.0 mm, a width of 1.2 mm, and a thickness of 0.65 mm, but the configuration is not limited thereto.

On the other hand, the body B includes the molded portion 100 and the cover portion 200, and the cover portion 200 is disposed on an upper portion of the molded portion 100, to surround all surfaces except for a lower surface of the molded portion, based on FIG. 1. Accordingly, the first to fifth surfaces 101, 102, 103, 104 and 105 of the body B are formed by the cover portion 200, and the sixth surface 106 of the body B is formed by the molded portion 100 and the cover portion 200.

The molded portion 100 has one surface and the other surface opposing each other. The molded portion 100 includes a support portion 110 and a core 120. The core 120 is disposed on a central portion of one surface of the support portion 110, in a form extending from the support portion 110 to penetrate through the wound coil 300. Therefore, in this specification, one surface and the other surface of the molded portion 100 are used with the same meaning as one surface and the other surface of the support portion 110, respectively.

The thickness of the support portion 110 may be 200 µm or more. If the thickness of the support portion 110 is less than 200 µm, securing rigidity may be difficult. The thickness of the core 120 may be 150 µm or more, but is not limited thereto.

The cover portion 200 covers the molded portion 100, and the wound coil 300 to be described later. The cover portion 200 may be disposed on the support portion 110 and the core 120 of the molded portion 100, and the wound coil 300, and may then be pressed to be coupled to the molded portion 100.

At least one of the molded portion 100 and the cover portion 200 includes a magnetic material. In the case of the embodiment, both the molded portion 100 and the cover portion 200 include a magnetic material. The molded portion 100 may be formed by filling a mold for forming the molded portion 100 with a magnetic material. Alternatively, the molded portion 100 may be formed by filling a mold with a composite material including a magnetic material and an insulating resin.

The magnetic material may be ferrite or magnetic metal powder.

Ferrite powder particles may be at least one or more of, for example, spinel type ferrites such as Mg—Zn-based, Mn—Zn-based, Mn—Mg-based, Cu—Zn-based, Mg—Mn—Sr-based and Ni—Zn-based ferrites, hexagonal ferrites such as Ba—Zn-based, Ba—Mg-based, Ba—Ni-based, Ba—Co-based and Ba—Ni—Co-based ferrites, garnet type ferrites such as Y series, and Li ferrites.

The magnetic metal powder may include one or more selected from the group consisting of iron (Fe), silicon (Si), chromium (Cr), cobalt (Co), molybdenum (Mo), aluminum (Al), niobium (Nb), copper (Cu) and nickel (Ni). For example, the magnetic metal powder may be at least one or more of pure iron powder, Fe—Si alloy powder, Fe—Si—Al alloy powder, Fe—Ni alloy powder, Fe—Ni—Mo alloy powder, Fe—Ni—Mo—Cu alloy powder, Fe—Co alloy powder, Fe—Ni—Co alloy powder, Fe—Cr alloy powder, Fe—Cr—Si alloy powder, Fe—Si—Cu—Nb alloy powder, Fe—Ni—Cr alloy powder, and Fe— Cr—Al alloy powder.

The magnetic metal powder may be amorphous or crystalline. For example, the magnetic metal powder may be a Fe—Si—B—Cr-based amorphous alloy powder, but is not limited thereto.

Ferrite and magnetic metal powder may each have an average diameter of about 0.1 µm to 30 µm, but are not limited thereto.

Each of the molded portion 100 and the cover portion 200 may include two or more types of magnetic materials. In this case, that the magnetic materials are of different types means that the magnetic materials are distinguished from each other by any one of an average diameter, composition, crystallinity, and shape.

The insulating resin may include, but is not limited to, epoxy, polyimide, liquid crystal polymer, or the like alone or as a mixture.

The wound coil 300 is embedded in the body B to express the characteristics of the coil component 1000. For example, when the coil component 1000 of the present embodiment is used as a power inductor, the wound coil 300 may serve to stabilize the power of an electronic device by storing an electric field as a magnetic field and maintaining an output voltage.

The wound coil 300 is disposed between the molded portion 100 and the cover portion 200, for example, on the other surface of the molded portion 100. In detail, the wound coil 300 is wound around the core 120 and is disposed on the other surface of the support portion 110.

The wound coil 300 is an air-core coil, and may be comprised of a flat coil. The wound coil 300 may be formed by winding a metal wire such as a copper wire of which the surface is coated with an insulating material in a spiral shape. In this case, the insulating material may function as a dielectric layer as the wound coil 300 and the first noise removal portion 400 are capacitively coupled to each other.

The wound coil 300 may be comprised of a plurality of layers. Each layer of the wound coil 300 is formed in a planar spiral, and may have a plurality of turns. For example, the wound coil 300 forms an innermost turn T1, at least one intermediate turn T2, and an outermost turn T3, outwardly from the center of the other surface of the mold 100.

On the other hand, the first insulating layer 310 is disposed between the wound coil 300 and the first noise removal portion 400 to be described later. Referring to FIG. 3, the first insulating layer 310 may be disposed along the respective surfaces of a plurality of turns of the wound coil 300. The first insulating layer 310 is to protect and insulate a plurality of turns of each wound coil 300, and may include a known insulating material such as parylene. Any insulating material included in the first insulating layer 310 may be used, and there is no particular limitation. The first insulating layer 310 may be formed by a method such as vapor deposition or the like, but the method is not limited thereto. In this case, the first insulating layer 310 may function as a dielectric layer as the wound coil 300 and the first noise removal portion 400 are capacitively coupled to each other.

The first and second receiving grooves h1 and h2 are formed to be spaced apart from each other in one surface of the body B. The receiving grooves h1 and h2 may be disposed outside of a region corresponding to the core 120 in one surface of the body B. To secure the magnetic flux area, the positions of the first and second receiving grooves h1 and h2 may be outside of the region corresponding to the core 120 in one surface of the body B.

The first and second receiving grooves h1 and h2 may respectively have a shape extending in the width direction of the body B in one surface of the body B. In an embodiment, since the body B is an area including the molded portion 100 and the cover portion 200, one surface of the body B refers to one surface of the area including the molded portion 100 and the cover portion 200. The first and second receiving grooves h1 and h2 are disposed in one surface of the body B, and thus, are not limited to being disposed in the molded portion 100, and may also be formed in an area in which the cover portion 200 is formed in one surface of the body B. One end of the wound coil 300 is disposed in the first receiving groove h1 and the other end of the wound coil 300 is disposed in the second receiving groove h2, to be spaced apart from each other. The first and second receiving grooves h1 and h2 are regions in which both ends of the wound coil 300 are led out to the first and second external electrodes 610 and 620, and thus, may be spaced apart from each other in one surface of the body B, to correspond to the first and second external electrodes 610 and 620, respectively.

The first and second receiving grooves h1 and h2 may also be formed in a process of forming the molded portion 100. When the first and second receiving grooves h1 and h2 are formed by filling a mold for forming the molded portion 100 with a magnetic material, a pair of first and second through-grooves H1 and H2 penetrating through the support portion 110 may be formed, and both ends of the wound coil 300 may be disposed in the first and second through-grooves H1 and H2, respectively. As an example, in this embodiment, the first and second through-grooves H1 and H2 and the first and second receiving grooves h1 and h2 are integrally formed, such that the first and second through-grooves H1 and H2 and the first and second receiving grooves h1 and h2 may be disposed in the molded portion 100.

Both ends of the wound coil 300 are exposed to one surface of the support portion 110, for example, to the sixth surface 106 of the body B. Both ends of the wound coil 300, exposed to one surface of the support portion 110, are disposed in the first and second receiving grooves h1 and h2 formed to be spaced apart from each other in one surface of the body B.

For example, both ends of the wound coil 300 may penetrate through the support portion 110 of the molded portion 100 and be exposed to one surface of the support portion 110. Although not specifically illustrated, both ends of the wound coil 300 are the same as the thickness of the wound coil 300 and may have a shape protruding from the other surface of the support portion 110 by the thickness of the wound coil 300. However, in the process of polishing the openings of the plating resist for forming the external electrodes 610 and 620 to be described later, the protruding ends may also be polished, so that the ends of the wound coil 300 exposed to one surface of the support portion 110 may be substantially less than the thickness of the wound coil 300.

The first noise removal portion 400 is disposed in the body 100 to discharge noise transmitted to the component and/or noise generated from the component to a mounting substrate and the like.

Referring to FIG. 5, the first noise removal portion 400 may be formed between an outermost turn of the wound coil 300 and the cover portion 200, in such a manner that one end thereof may be exposed to the surface of the body 100. The first noise removal portion 400 includes an end exposed to one surface of the molded portion 100.

The first noise removal portion 400 forms a plurality of turns to correspond to an area in which the wound coil 300 is disposed. In addition, a width W of the first noise removal portion 400 may be less than a thickness T thereof.

The thickness T of the first noise removal portion 400 may refer to a dimension of one turn of the first noise removal portion 400 in a cross-section shown, for example, FIG. 4 or FIG. 5, measured in a vertical direction such as the Z direction, along which the core 120 extends from the base portion 110, and the width W of the first noise removal portion 400 may refer to a dimension of the one turn of the first noise removal portion 400 in the cross-section, measured in a horizontal direction along a surface of base portion 110. Measurements may be performed based on an optical image obtained, for example, a scanning electron microscope. The same measurement metrology may be applied to measure the thickness T and the width W. Other methods and/or tools appreciated by one of ordinary skill in the art, even if not described in the present disclosure, may also be used. As a result, on the X-Y plane, the area occupied by the wound coil 300 in the body B may be relatively increased. For example, inductance characteristics and DC resistance characteristics of the entire coil component may be improved.

In the case of a related art coil component that does not include a noise removal portion in the component, a signal having a relatively low frequency from a direct current may pass well, but the noise removal effect rapidly deteriorates at a frequency equal to or higher than the self-resonance frequency (SRF). Meanwhile, in the case of the present embodiment in which the noise removal portion 400 is formed adjacent to the wound coil 300, while passing a signal of relatively low frequency from a direct current well, unnecessary relatively higher frequency noise is effectively prevented when compared with the related art coil component.

The first noise removal portion 400 may include a conductive material such as copper (Cu), aluminum (Al), silver (Ag), tin (Sn), gold (Au), nickel (Ni), lead (Pb), titanium (Ti), or alloys thereof, but the present disclosure is not limited thereto. The first noise removal portion 400 may be formed by a method including at least one of a vapor deposition method such as an electroless plating method, an electroplating method, and sputtering, and an etching method, but the forming method is not limited thereto.

On the other hand, a second insulating layer 430 is disposed between the wound coil 300 and the first noise removal portion 400. Referring to FIGS. 4 and 5, the second insulating layer 430 may be disposed along the surface of the first noise removal portion 400. The second insulating layer 430 is provided to protect and insulate the turn of the first noise removal portion 400, and may include a known insulating material such as parylene. Any insulating material included in the second insulating layer 430 may be used, and there is no particular limitation thereon. The second insulating layer 430 may be formed by a method such as vapor deposition, but the forming method is not limited thereto. In this case, the second insulating layer 430 may function as a dielectric layer since the wound coil 300 and the first noise removal portion 400 are capacitively coupled to each other.

The third receiving groove h3 is formed in one surface of the body B to be spaced apart from the respective first and second receiving grooves h1 and h2. In this embodiment, the third receiving groove h3 is disposed to be spaced apart from the first and second receiving grooves h1 and h2 in one surface of the molded portion 100. The third receiving groove h3 accommodates one end of the first noise removal portion 400.

The third receiving groove h3 may have a shape extending in the width direction of the body B in one surface of the body B. The third receiving groove h3 is disposed in one surface of the body B, and thus, is not limited to being disposed in the molded portion 100, and may also be disposed in an area in which the cover portion 200 is formed in one surface of the body B. The third receiving groove h3 is an area in which one end of the first noise removal portion 400 is led out to a third external electrode 700, and may thus be separated to respectively correspond to the third external electrode 700.

The third receiving groove h3 may also be formed in the process of forming the molded portion 100. In the case in which the third receiving groove h3 is formed by filling a mold for forming the molded portion 100 with a magnetic material, a third through-groove h3 penetrating through a support portion 110 is formed, and one end of the first noise removal portion 400 may be disposed in the third through-groove H3. As an example, in this embodiment, the third through-groove H3 and the third receiving groove h3 are integrally formed so that the third through-groove H3 and the third receiving groove h3 may be disposed in the molded portion 100.

One end of the first noise removal portion 400 is exposed to one surface of the support portion 110, for example, to the sixth surface 106 of the body B. One end of the first noise removal portion 400 exposed to one surface of the support portion 110 is disposed in the third receiving groove h3 formed in one surface of the body B.

For example, one end of the first noise removal portion 400 may penetrate through the support portion 110 of the molded portion 100 and be exposed to one surface of the support portion 110. Although not specifically illustrated, one end of the first noise removal portion 400 is the same as the thickness of the first noise removal portion 400 to have a shape protruding by a degree corresponding to the thickness of the first noise removal portion 400 to the other surface of the support portion 110. However, in the process of polishing the opening of the plating resist for forming the third external electrode 700, to be described later, the protruding end may also be polished, so that the end of the first noise removal portion 400 exposed to one surface of the support portion 110 may be substantially smaller than the thickness of the first noise removal portion 400.

One end of the first noise removal portion 400 may be disposed in the third receiving groove h3 through a side surface of the molded portion 100. Referring to FIG. 3, the third through-groove H3 may be formed in one side of the molded portion 100. The third receiving groove h3 formed in one surface of the molded portion 100 may extend to one side of the molded portion 100 to be connected to the third through-groove H3 formed in one side of the molded portion 100.

The first and second external electrodes 610 and 620 may be disposed to be spaced apart from each other on one surface of the body B, for example, on the sixth surface 106, and in detail, may be disposed to be spaced apart from each other on one surface of the support portion 110 and may be integrally formed by being connected to both ends of the wound coil 300, respectively.

Each of the first and second external electrodes 610 and 620 may be formed in a single layer or multiple layer structure. For example, each of the first and second external electrodes 610 and 620 may be comprised of a first layer (not illustrated) including copper (Cu), a second layer (not illustrated) disposed on the first layer and including nickel (Ni), and a third layer (not illustrated) disposed on the second layer and including tin (Sn). The first and second external electrodes 610 and 620 may be formed by electroplating, but the process is not limited thereto.

The first and second external electrodes 610 and 620 may be formed of a conductive material such as copper (Cu), aluminum (Al), silver (Ag), tin (Sn), gold (Au), nickel (Ni), lead (Pb), chromium (Cr), titanium (Ti), or alloys thereof, but the material thereof is not limited thereto.

The first and second external electrodes 610 and 620 electrically connect the coil component 1000 to a mounting board when the coil component 1000 according to the present embodiment is mounted on a mounting board such as a printed circuit board. As an example, the coil component 1000 according to the present embodiment may be mounted such that the sixth surface 106 of the body B faces the upper surface of the printed circuit board, and the first and second external electrodes 610 and 620 that are formed to extend to the sixth surface 106 of the body B, and connection portions of the printed circuit board, may be electrically connected by a conductive coupling member such as solder or the like.

The third external electrode 700 is disposed on the sixth surface 106 of the body B to be spaced apart from the first and second external electrodes 610 and 620, and is connected to one end of the first noise removal portion 400. For example, the third external electrode 700 is connected to one end of the first noise removal portion 400 and is connected to a ground such as a mounting board or the like.

The third external electrode 700 may include at least one of a conductive resin layer and an electroplating layer. The conductive resin layer may be formed by paste printing or the like, and may include any one or more conductive metals selected from the group consisting of copper (Cu), nickel (Ni), and silver (Ag), and a thermosetting resin. The electroplating layer may include at least one selected from the group consisting of nickel (Ni), copper (Cu), and tin (Sn).

Second Embodiment

Figure 6:
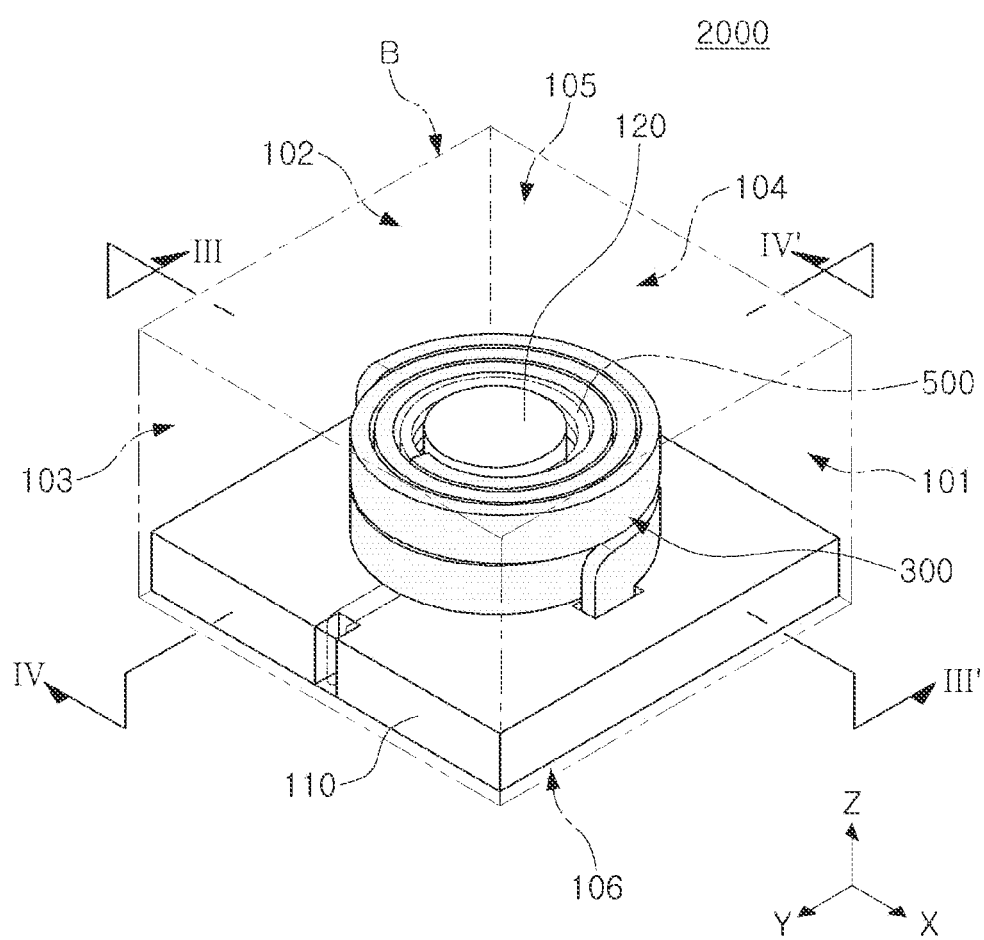
FIG. 6 is a view schematically illustrating a coil component according to a second embodiment.
Figure 7:
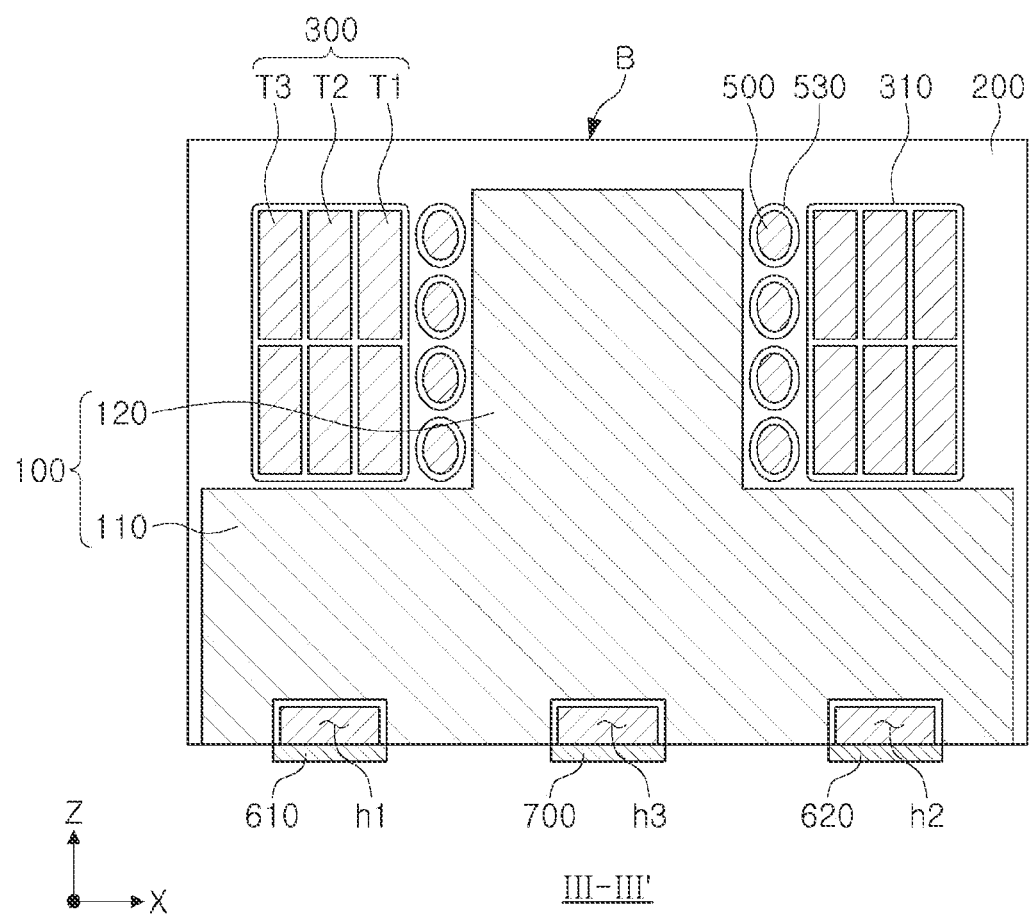
FIG. 7 is a view illustrating a cross section taken along line of FIG. 6.
Figure 8:
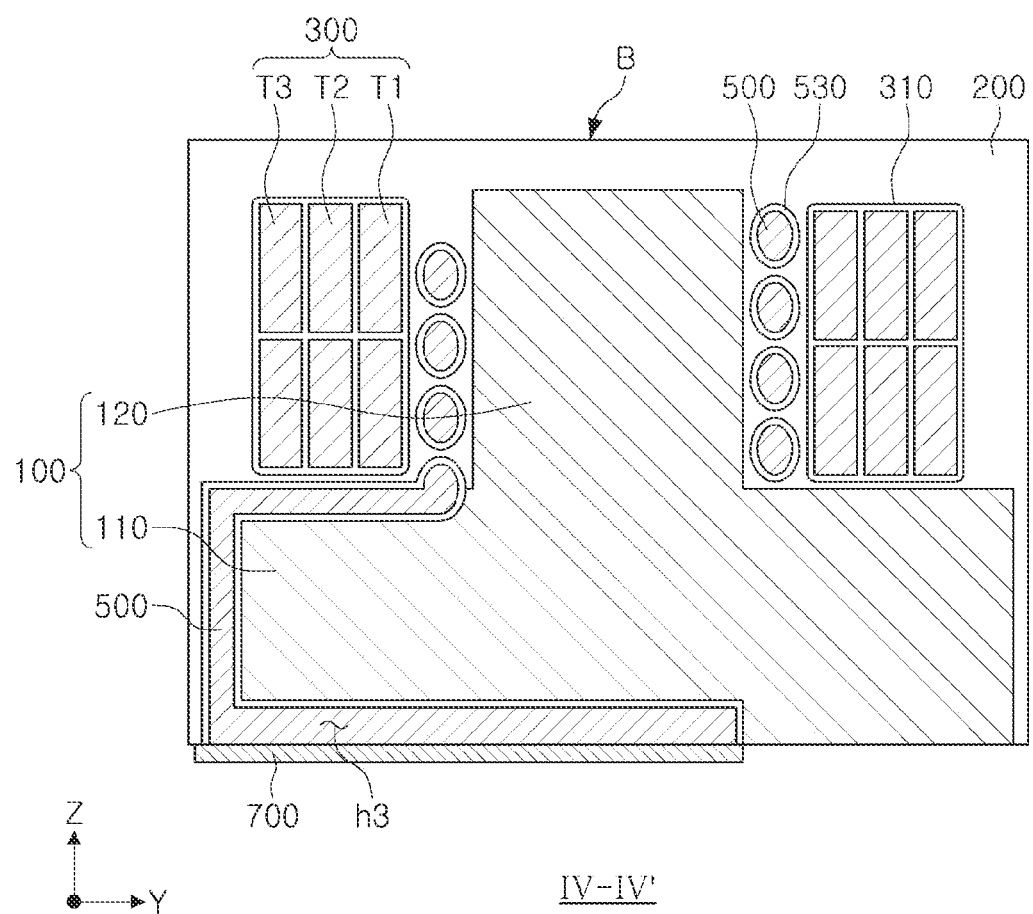
FIG. 8 is a view illustrating a cross section taken along line IV-IV' of FIG. 6.

FIG. 6 is a diagram schematically illustrating a coil component according to a second embodiment. FIG. 7 is a diagram illustrating a cross section taken along line III-III' of FIG. 6. FIG. 8 is a diagram illustrating a cross section taken along line IV-IV' of FIG. 6.

Referring to FIGS. 6 to 8, the coil component according to the present embodiment is different from the coil component according to the first embodiment, in that it includes a second noise removal portion 500 to be adjacent to an innermost turn of the wound coil 300. Therefore, in describing the present embodiment, only the second noise removal portion 500 different from that of the first embodiment will be described. For the rest of the configuration of the present embodiment, the description in the first embodiment may be applied as it is.

The coil component of this embodiment includes the second noise removal portion 500 formed to be adjacent to the innermost turn of the wound coil 300. Specifically, the second noise removal portion 500 is formed between the innermost turn of the wound coil 300 and the core 120 so that one end thereof is exposed to one surface of the molded portion 100.

Referring to FIGS. 6 and 8, one end of the second noise removal portion 500 is disposed on the other surface of the molded portion 100 and extends from the core 120 side to the cover portion 200 side. Both ends of the wound coil 300 are disposed in the first and second receiving grooves h1 and h2, respectively, through side surfaces of the molded portion 100.

In this embodiment, the third receiving groove h3 is disposed to be spaced apart from the first and second receiving grooves h1 and h2 in one surface of the molded portion 100 to receive one end of the second noise removal portion 500. One end of the second noise removal portion 500 may be disposed in the third receiving groove h3 through a side surface of the molded portion 100.

First Modified Example of Second Embodiment

Figure 9:
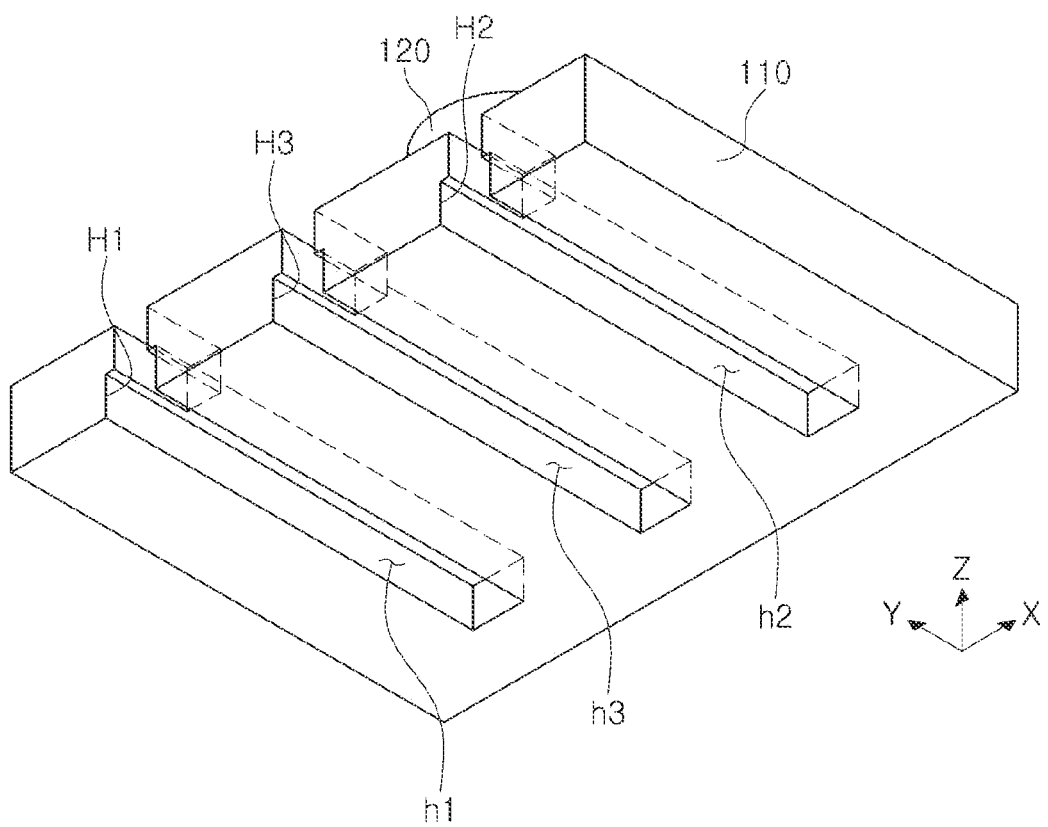
FIG. 9 is a perspective view of a molded portion applied to a first modified example of the second embodiment.

FIG. 9 is a perspective view of a molded portion applied to a first modified example of the second embodiment as viewed from the bottom.

Referring to FIG. 9, a coil component according to the present modification has a different arrangement structure of receiving grooves h1 and h2 as compared to those of the coil component according to the first embodiment. Therefore, in describing the present modified example, only the arrangement structure of the receiving grooves h1 and h2 different from the first embodiment will be described. For the rest of the configuration of this modification, the description in the first embodiment may be applied as it is.

Both ends of the wound coil 300 may be disposed in the first and second receiving grooves h1 and h2 through side surfaces of the molded portion 100, respectively.

Referring to FIG. 5, through grooves H1 and H2 may be formed in one side of the molded portion 100. The receiving grooves h1 and h2 formed in one surface of the molded portion 100 may extend to one side of the molded portion 100 to be connected to the through grooves H1 and H2 formed in one side of the molded portion 100. Referring to FIG. 5, the width of the receiving grooves h1 and h2 is illustrated as being greater than the width of the through grooves H1 and H2, but since the form in which the end of the wound coil 300 is disposed in the receiving grooves h1 and h2 is not limited, the width of the receiving grooves h1 and h2 may be the same as the width of the through grooves H1 and H2.

The receiving grooves h1 and h2 and the through-grooves H1 and H2 may be formed in the molded portion 100 in a process of laminating and pressing a magnetic sheet including a magnetic material on the molded portion 100. For example, both ends of the wound coil 300 protruding from the side and one surface of the molded portion 100 are embedded inside the molded portion 100 in the magnetic sheet pressing process. Alternatively, as described above, the receiving grooves h1 and h2 and the through-grooves H1 and H2 may be formed in a process of forming the molded portion 100 using a mold. In this case, in the mold used to form the molded portion 100, protruding portions corresponding to the receiving grooves h1 and h2 and the through-grooves H1 and H2 may be formed.

As set forth above, according to an exemplary embodiment, noise may be easily removed.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A coil component comprising:
   a body including a core, a molded portion having one surface and the other surface opposing each other, and a side surface connecting the one surface and the other surface, and a cover portion disposed on the molded portion;
   first and second receiving grooves disposed in the one surface of the molded portion to be spaced apart from each other and disposed outside of a region corresponding to the core in the one surface of the molded portion;
   a wound coil disposed between the molded portion and the cover portion, having a plurality of turns around the core, and having both ends extending through at least a portion of the molded portion; and
   a noise removal portion disposed between an outermost turn of the wound coil and the cover portion, in such a manner that one end of the noise removal portion is exposed to the one surface of the molded portion,
   wherein the noise removal portion has a plurality of turns stacked in a direction parallel to a winding axis of the wound coil.

2. The coil component of claim 1, wherein a width of the noise removal portion is less than a thickness of the noise removal portion.

3. The coil component of claim 1, further comprising a third receiving groove disposed to be spaced apart from the first and second receiving grooves in the one surface of the molded portion, to receive the one end of the noise removal portion.

4. The coil component of claim 3, wherein the noise removal portion is disposed in the third receiving groove through the side surface of the molded portion.

5. The coil component of claim 1, wherein both ends of the wound coil pass through the molded portion, respectively.

6. The coil component of claim 1, wherein both ends of the wound coil are disposed in the first and second receiving grooves, respectively.

7. The coil component of claim 1, wherein the wound coil has an innermost turn adjacent to the core, at least one intermediate turn, and the outermost turn adjacent to the cover portion.

8. The coil component of claim 1, further comprising first and second external electrodes disposed to be spaced apart from each other on the one surface of the body, and connected to both ends of the wound coil, respectively.

9. The coil component of claim 1, further comprising a third external electrode disposed on the one surface of the body and connected to the one end of the noise removal portion.

10. A coil component comprising:
    a body including a base portion having one surface and the other surface opposing each other, and a core extending from the other surface of the base portion;
    first and second receiving grooves spaced apart from each other in the one surface of the base portion;
    a wound coil having a plurality of conductive turns around the core, and having ends disposed in the first and second receiving grooves, respectively; and
    a noise removal portion including a plurality of conductive turns around the core,
    wherein only one end of the noise removal portion extends through the base portion to the one surface of the base portion, and
    the plurality of conductive turns of the noise removal portion are stacked in a direction parallel to a winding axis of the wound coil.

11. The coil component of claim 10, wherein in a cross section of one turn of the plurality of conductive turns, a width of the one turn in a direction from the one turn towards the core is less than a thickness of the one turn in a direction from the one turn towards the other surface.

12. The coil component of claim 10, further comprising a third receiving groove disposed between the first and second receiving grooves in the one surface of the base portion, to receive the only one end of the noise removal portion.

13. The coil component of claim 12, further comprising:
    first and second external electrodes disposed on the first and second receiving grooves, and connected to the ends of the wound coil, respectively; and a third external electrode disposed on the third receiving groove and connected to the only one end of the noise removal portion.

14. The coil component of claim 10, wherein the body further comprises a cover portion covering the wound coil, the noise removing portion, the core, and the other surface of the base portion.

15. A coil component comprising:
a body including a core, a molded portion having one surface and the other surface opposing each other, and a side surface connecting the one surface and the other surface, and a cover portion disposed on the molded portion;
first and second receiving grooves disposed in the one surface of the molded portion to be spaced apart from each other and disposed outside of a region corresponding to the core in the one surface of the molded portion;
a wound coil disposed between the molded portion and the cover portion, having a plurality of turns around the core, and having both ends extending through at least a portion of the molded portion;
a noise removal portion disposed between an outermost turn of the wound coil and the cover portion, in such a manner that one end of the noise removal portion is exposed to the one surface of the molded portion; and
a third receiving groove disposed to be spaced apart from the first and second receiving grooves in the one surface of the molded portion, to receive the one end of the noise removal portion.

16. The coil component of claim 15, wherein a width of the noise removal portion is less than a thickness of the noise removal portion.

17. The coil component of claim 15, wherein both ends of the wound coil pass through the molded portion, respectively.

18. The coil component of claim 15, wherein the noise removal portion is disposed in the third receiving groove through the side surface of the molded portion.

19. The coil component of claim 15, wherein both ends of the wound coil are disposed in the first and second receiving grooves, respectively.

20. The coil component of claim 15, further comprising:
first and second external electrodes disposed to be spaced apart from each other on the one surface of the body, and connected to both ends of the wound coil, respectively;
a third external electrode disposed on the one surface of the body and connected to the one end of the noise removal portion.

* * * * *